United States Patent [19]

Wanlass

[11] Patent Number: 4,649,859

[45] Date of Patent: Mar. 17, 1987

[54] REACTOR DESIGN FOR UNIFORM CHEMICAL VAPOR DEPOSITION-GROWN FILMS WITHOUT SUBSTRATE ROTATION

[75] Inventor: Mark Wanlass, Golden, Colo.

[73] Assignee: The United States of America as represented by the United States Department of Energy, Washington, D.C.

[21] Appl. No.: 702,692

[22] Filed: Feb. 19, 1985

[51] Int. Cl.⁴ .......................................... H01L 21/205
[52] U.S. Cl. .................................. 118/715; 118/719; 118/728; 156/611
[58] Field of Search ................... 118/715, 728, 719; 156/611

[56] References Cited

U.S. PATENT DOCUMENTS

| | | | |
|---|---|---|---|
| 3,472,684 | 10/1969 | Walther | 156/611 |
| 3,735,727 | 5/1973 | Sussmann | 118/715 |
| 4,108,106 | 8/1978 | Dozier | 118/715 |
| 4,354,455 | 10/1982 | Looney | 118/715 |
| 4,421,786 | 12/1983 | Mahajan | 118/728 |

FOREIGN PATENT DOCUMENTS 53-11576 2/1978 Japan ................................. 156/611

OTHER PUBLICATIONS

Eshbach et al. "Emitter Diffusion System", IBM TDB, vol. 13, No. 6, Nov. 1970, p. 1459.

*Primary Examiner*—John D. Smith
*Attorney, Agent, or Firm*—Kenneth L. Richardson; James W. Weinberger; Judson R. Hightower

[57] ABSTRACT

A quartz reactor vessel for growth of uniform semiconductor films includes a vertical, cylindrical reaction chamber in which a substrate-supporting pedestal provides a horizontal substrate-supporting surface spaced on its perimeter from the chamber wall. A cylindrical confinement chamber of smaller diameter is disposed coaxially above the reaction chamber and receives reaction gas injected at a tangent to the inside chamber wall, forming a helical gas stream that descends into the reaction chamber. In the reaction chamber, the edge of the substrate-supporting pedestal is a separation point for the helical flow, diverting part of the flow over the horizontal surface of the substrate in an inwardly spiraling vortex.

9 Claims, 5 Drawing Figures

REACTOR DESIGN FOR UNIFORM CHEMICAL VAPOR DEPOSITION-GROWN FILMS WITHOUT SUBSTRATE ROTATION

CONTRACTUAL ORIGIN OF THE INVENTION

The United States Government has rights in this invention under Contract No. DE-AC02-83CH10093 between the United States Department of Energy and the Solar Energy Research Institute, a division of the Midwest Research Institute.

BACKGROUND OF THE INVENTION

1. Field of the Invention

The invention generally relates to coating apparatus for use in gas or vapor deposition. The invention also generally relates to coating apparatus for use in semiconductor vapor doping. More specifically, a reactor design includes a multizone chamber to carry out a method of uniformly coating a stationary workpiece on a stationary work support.

2. Description of the Prior Art

In the art of growing semiconductor films, uniform growth is essential. A single crystal epitaxial film is often grown on a suitable substrate by the chemical vapor deposition (CVD) process, in which the elements of the desired crystal are introduced in gas phase compounds that are cracked by heat into their constituents in the area of the substrate, where the appropriate elements combine to form the crystal layer. A variety of factors, well-known in the art, tend to cause uneven crystal growth and variation in crystal composition over the surface of a substrate. For example, when a group 3-group 5 compound semiconductor such as $GaAs_{1-x}P_x$ is grown with vertical gas flow against a horizontal substrate, the thickness of the crystal may be greater in the center of the substrate and thinner at the edges. At the same time, the percentage of gallium phosphide in the alloy may be lowest in the center of the substrate and greatest at the edges. The resulting crystal is subject to substantial differences in overall thickness, local composition, and local electrical characteristics.

Therefore, the use of chemical vapor deposition (CVD) processes involves special reactor design criteria. Two reactor configurations generally are used to satisfy the uniformity requirement. In the first, commonly used in a horizontally oriented reaction chamber, a pedestal supports the substrate to be coated at an acute angle to the impinging gas flow. The optimum substrate angle is empirically determined, involving considerable time and effort. In a second configuration, often used in a vertically oriented reaction chamber, the substrate is supported on a pedestal in a plane perpendicular to the direction of gas flow and, additionally, the pedestal is rotated in the perpendicular plane. A combination of these two methods has been used in vertical flow systems, wherein the substrate is carried at an acute angle to the input gas flow with the pedestal being rotated on an axis parallel and concentric to gas flow.

These known methods involve a variety of problems and disadvantages. One problem is that deposition uniformity is altered by convection currents. The substrate usually is carried on a susceptor of graphite, which is heated by RF heating to cause the desired cracking. Convection currents that result from the heating may alter the gas flow that otherwise would cause uniform crystal growth. Another problem arises from the use of a rotating pedestal, which requires a leak-proof rotating seal to avoid system contamination, in turn resulting in complicated and costly reactor designs. Another problem is that few reactors can meet the high standards for uniformity that are required for the growth of a "superlattice," involving the formation of multiple thin (i.e., 100 Angstrom) layers of differing composition on the same substrate. It is desired to grow such superlattices in a single, continuous process by changing the composition of the input gas at rapid intervals, which requires that the reactor be able to grow a uniform layer under all of the different gas compositions and with a sharp interface between changed compositions.

A more simplified approach to preparing uniform semiconductor films has been a long time objective by many skilled persons in the semiconductor film deposition art. It would be of particular advantage to eliminate the need for a rotating pedestal in vertical flow reactors. Similarly, it would be desirable to eliminate the need to empirically determine the optimum angle for the pedestal in horizontal flow reactors. Still another benefit would result by eliminating convection current problems. To achieve the foregoing and other objects and in accordance with the purpose of the present invention, as embodied and broadly described herein, the apparatus and method of this invention may comprise the following.

SUMMARY OF THE INVENTION

Against the described background, it is therefore a general object of the invention to provide an improved reactor vessel design, useful for chemical vapor deposition (CVD) processes wherein a reaction gas is uniquely passed over a target substrate or sample in a manner to uniformly grow or deposit a semiconductor film thereon without a need to rotate the sample within the reactor vessel.

Another general object is to provide a reactor vessel design suited for growing CVD films wherein the optimum position of a stationary target substrate or sample with respect to the direction of input gas flow is predetermined at the time of reactor design, such that empirical determination of target angle is unnecessary.

A more specific object is to provide a reactor design that has substantially reproducible CVD film growth characteristics among a plurality of samples, such that the performance of a reactor for CVD growth can be reliably predicted in advance of use, despite a range of variability in exact reactor configuration, as would be expected among blown quartz glass objects.

Another specific object is to provide a reaction chamber design for the practice of chemical vapor deposition wherein changes in the convective effects resulting from variation in substrate temperature substantially do not alter the uniformity of film growth.

Still another specific object is to provide a method and apparatus for directing an input gas flow over a substrate surface such that a gas flow pattern is created that accommodates uniform crystal growth on the substrate surface despite changing concentration of the gaseous reactants in the gas stream as portions of the gas stream undergo increasing exposure with the substrate surface.

A further object is to provide a reactor with a gas flow pattern that is relatively insensitive to differing cracking efficiencies of the constituents of input gas mixtures, such that the percentage of each element in the grown layer is substantially uniform across the entire layer.

A further specific object is to provide a reactor vessel suited for the growth of superlattices, wherein sharp interfaces between layers can be coupled with continuous growth by changing input gas composition.

A final object is to provide a reactor vessel and method for practicing organo-metallic chemical vapor deposition (OMCVD) for the growth of any group 3-group 5 compound semiconductor film.

Additional objects, advantages, and novel features of the invention shall be set forth in part in the description that follows, and in part will become apparent to those skilled in the art upon examination of the following or may be learned by practice of the invention. The object and the advantages of the invention may be realized and attained by means of the instrumentalities and in combinations particularly pointed out in the appended claims.

According to the invention, a reactor vessel for chemical vapor deposition of a uniform semiconductor film on a substrate is provided with a reaction chamber for receiving a substrate and a flow of reaction gas capable of depositing a film on the substrate under the conditions of the chamber. A supporting means carries the substrate within the reaction chamber in a predetermined relative position with respect to the chamber. In addition, the reaction vessel includes a means for introducing a reaction gas into the reaction chamber with a nonaxial flow having a rotational component with respect to a normal axis to the substrate surface such that the reaction gas defines a vortex flow pattern with respect to the substrate surface.

According to the method of the invention, a uniform film is grown on a substrate by chemical vapor deposition, wherein the substrate is supported in a substantially horizontal position, and a reaction gas is directed in an inward spiral or vortex pattern over the surface of the substrate under conditions suited to cause chemical vapor deposition of an epitaxial film on the substrate.

BRIEF DESCRIPTION OF THE DRAWINGS

The accompanying drawings, which are incorporated in and form a part of the specification, illustrate preferred embodiments of the present invention, and together with the description, serve to explain the principles of the invention. In the drawings.

DESCRIPTION OF THE PREFERRED EMBODIMENTS

Figure 1:
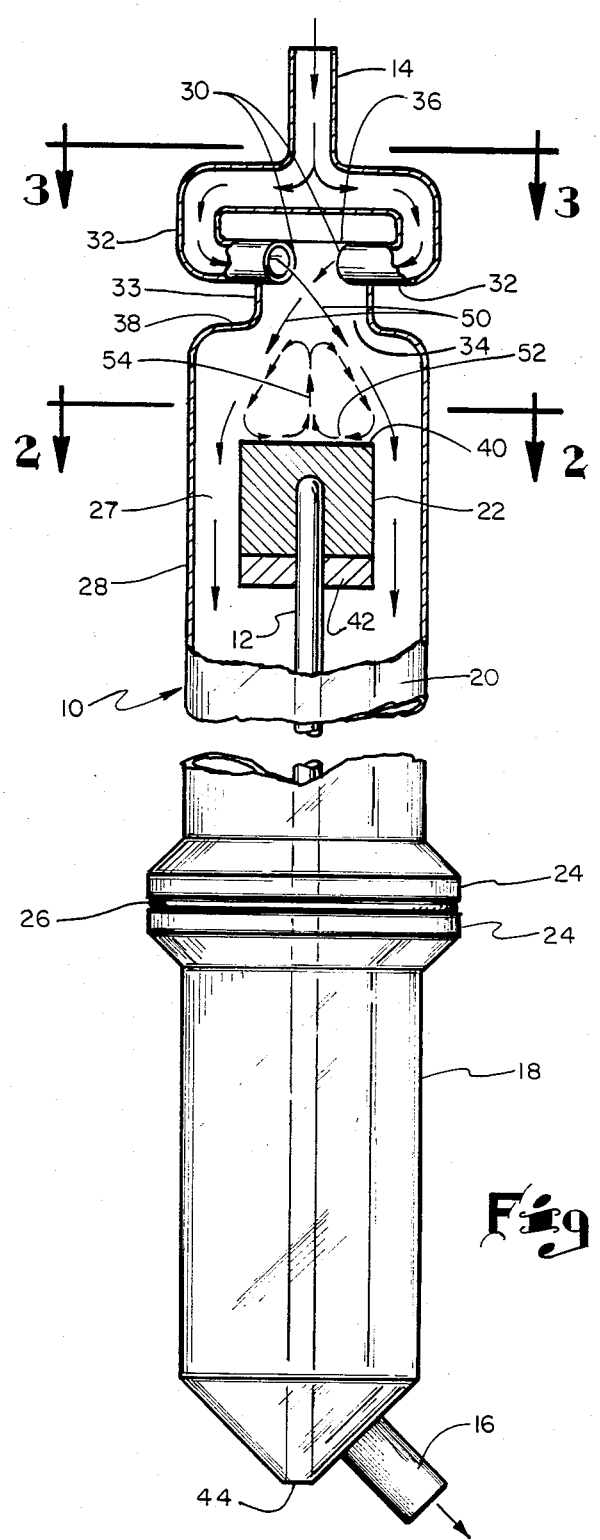
FIG. 1 is a side view of the reactor vessel in partial cross section, with the flow pattern of the reaction gas shown by arrows.

The reactor vessel 10 is best shown in FIG. 1 as a vertically oriented cylindrical chamber adapted to house a substrate or sample on a pedestal 12 inside the chamber. A reaction gas is introduced into the chamber at or above the level of the substrate under positive pressure through a conduit means 14, and an exit port 16 located near the bottom end of the chamber allows escape of residual gases after travel through the verrically elongated chamber. For convenience of construction and use, the reactor vessel 10 is formed in two major components: a base 18 that houses the exit port 16 and supports the pedestal 12, and an upper structure 20 that receives the upper portion of the pedestal and the susceptor 22. The base and upper structure are joined at flanges 24, which are sealed by a resilient O-ring 26 that prevents gas leaks.

In greater detail, the upper structure 20 of the vessel 10 includes a cylindrical reaction chamber 27 of a predetermined diameter as defined by side wall 28. Near the top of the reaction chamber, entrance ports 30 are formed in the side wall of the upper structure and serve to convey a stream of reaction gas received through one or more directional injection conduits 32. Preferably two of the directional injection conduits 32 should be used, and these should be evenly spaced around the circumference of the cylindrical chamber for uniform introduction of the reaction gas. The reaction gas, which is supplied under positive pressure, for example, from a pressurized cylinder, may be a mixture of several supply gases which mix together as they travel through conduit 14, resulting in a reaction gas that is of uniform composition before it reaches the injection conduits 32.

Figure 3:
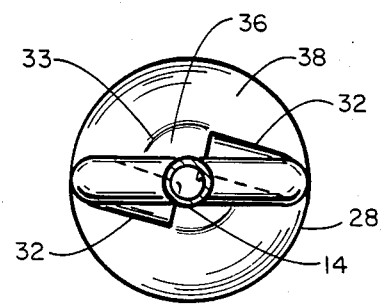
FIG. 3 is a cross-sectional view taken along the plane of line 3—3 of FIG. 1 and showing the orientation of the injection conduits to the confinement chamber.

With reference to FIG. 3, the injection conduits 32 are oriented with respect to the reaction chamber to direct the reaction gas into the chamber on a nonradial and nonaxial path, such that the reaction gas follows the chamber wall and acquires a rotational component in its flow pattern. Conduits 32 may be aligned with a chord of the circle defined by a horizontal cross section of the cylindrical chamber, with the preferred alignment being on a tangent to the inside surface of the cylinder wall at the entrance ports so that the gas flow is smoothly transitioned to the circular flow pattern.

In the preferred embodiment, the reaction chamber 27 includes an upper area or zone bounded by a cylindrical side wall 33 of reduced diameter. This confinement chamber 34 is a reception area for the reaction gas stream and serves to maintain the gas velocity, aid in mixing, and channel the gases toward the substrate surface. The top end of the confinement chamber 34 is closed by a top wall 36, and the side wall 33 of the confinement chamber is joined to the side wall 28 of the reaction chamber by a horizontal, annular connecting wall 38. Thus, injected reaction gas is received in upper zone 34 having no exit other than by downward gas flow into the lower zone of the reaction chamber. Reference to FIG. 1 shows that conduits 32 are horizontal immediately before entry into the confinement chamber and are immediately adjacent to the bottom face of the top wall 36. Because the reaction gas is injected into an area with a closed top and sides, a downward flow component is created, resulting in the gas following a descending helical path. Other techniques of achieving the flow pattern may include injecting the gas stream with a downward angle.

The sample support pedestal or central post 12 carries a cylindrical susceptor 22 of substantially smaller diameter than the reaction chamber and approximately equal to the diameter of the confinement chamber, with the upper, substrate-supporting face 40 of the susceptor closely spaced to but slightly below the bottom of the confinement chamber. The susceptor may be suitably supported on the pedestal by the elongated central post 12 and by a multiarmed spider 42, such that the susceptor will be located coaxially on the central axis of the cylindrical reaction chamber and at uniform side spacing from the reaction chamber side wall 28. The lower end of the pedestal 12 is fixed to the bottom wall 44 of base 18, resulting in a fixed spacing between the top of the pedestal and the top of the reaction chamber.

The reactor vessel 10 is formed from a nonreactive material such as quartz and is manufactured by glass blowing techniques. Although considerable variation is expected in such blown equipment, the following details and dimensions are provided to illustrate a preferred and operable configuration for the vessel: conduits 14 and 32 are formed from 3/8 in. (9.5 mm) outside diameter tubing; confinement chamber 34 is 3/4 in. (19.1 mm) in height and 1 in. (25.4 mm) in diameter; reaction chamber 27, within the upper structure, is 7 in. (177.8 mm) in height and 2 in. (50.8 mm) in diameter; the base structure 18 is 5 in. (127.0 mm) in height and of the same diameter as the reaction chamber; exit port 16 is of 1/2 in. (17.7 mm) tubing; and pedestal post 12 is of 7 mm diameter rod and is of a height sufficient that the upper surface of the susceptor 22 has a 3/8 in. (9.53 mm) clearance from the bottom of the confinement chamber.

Figure 2:
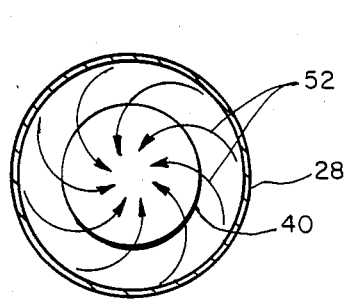
FIG. 2 is a cross-sectional view taken along the plane of line 2—2 of FIG. 1 and showing the gas flow pattern over the surface of the substrate.

The operation of the reactor and method of growing a uniform epitaxial film are best shown in FIGS. 1 and 2. A suitable substrate is loaded into the reactor by placing the substrate on the upper substrate-supporting face 40 of the susceptor. The size of the substrate should be no larger than the face of the susceptor so that the annular edge of face 40 marks the maximum lateral extension of the substrate. The base 18 and upper structure 20 are united at flanges 24, for example, held by clamps, causing the susceptor and substrate to be positioned approximately as shown in FIG. 1 with the susceptor coaxial with the cylindrical reaction chamber and spaced slightly below the confinement chamber. The susceptor is constructed from graphite, which is heated by RF heating to a suitable temperature for vapor phase epitaxy.

A reaction gas is pumped through conduit 14 under positive pressure. The gas follows injection conduits 32, which discharge the gas into the confinement chamber 34 through entry ports 30 with a nonaxial flow pattern having a rotational component. The gas is induced by the cylindrical shape of the confinement chamber wall 33 to follow a circular path, and, as illustrated by the arrows 50 in the confinement chamber of FIG. 1, the gas also descends into the lower volume of the reaction vessel. As the gas exits the confinement chamber and enters the top of the reaction chamber 27, the larger diameter of the latter chamber induces a radial expansion of the main, helical, descending flow. Subsequently, when the main gas flow encounters the face of the susceptor 22, the edge of face 40 serves as a separation point, causing a first portion of the main, helical gas flow to move inwardly over the face and its carried substrate with a spiral or vortex pattern as illustrated by the arrows 52 of FIG. 2. A second portion of the main, helical gas flow continues to descend along the sides of the susceptor, eventually exiting the vessel through exit port 16. The gas following the vortex pattern of FIG. 2 rises at the center of the pattern, as shown by arrows 54 in FIG. 1, and circulates back into the main, descending, helical flow.

The described reactor and method reliably grow semiconductor films with a high degree of uniformity in both thickness and composition. In addition, the flow patterns remain stable over a wide range of temperatures, substantially eliminating problems from convection currents. The excellent uniformity of the deposited films enables the reactor to be used for the growth of superlattices by the rapid switching of different reaction gases, which is aided by the unique closeness of the substrate pedestal to the gas inlets. Thus, as the gas composition is changed, the transition within the reaction chamber is rapidly seen by the substrate, resulting in sharp interfaces between layers of different compositions. Uniformity is further aided by the reactor vessel's relative insensitivity to differing cracking efficiencies of constituents of reaction gas mixtures.

Figure 4:
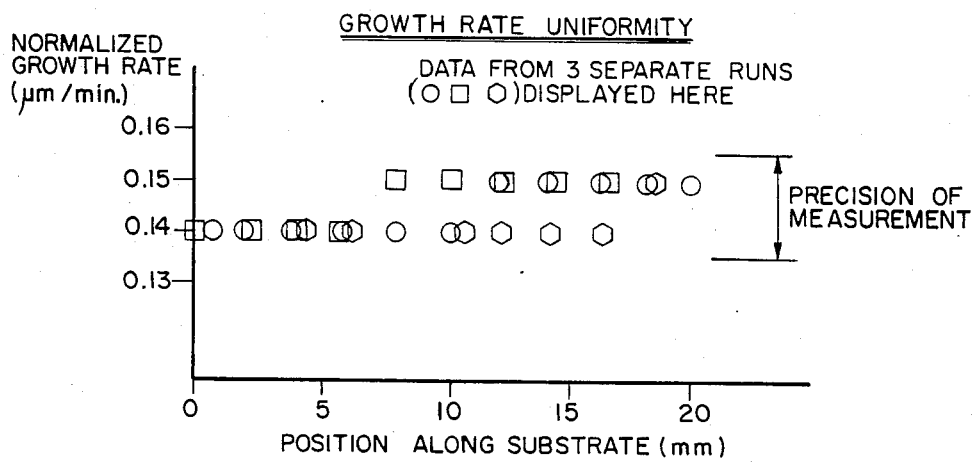
FIG. 4 is graph showing growth rate uniformity of a film grown in the reactor vessel.
Figure 5:
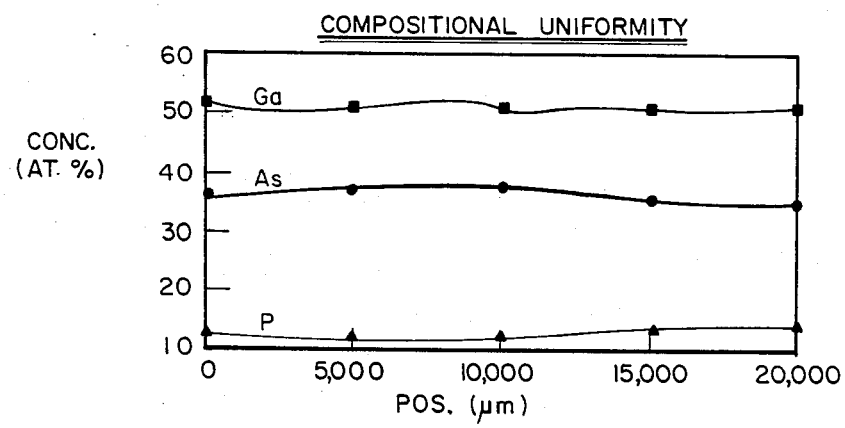
FIG. 5 is a graph showing compositional uniformity of a film grown in the reactor vessel.

As an example of the high uniformity of layer growth, FIGS. 4 and 5 show the results of growing $GaAs/GaAs_{1-x}P_x$ structures by the one atmosphere organometallic CVD (OMCVD) method. FIG. 4 shows the normalized growth rate for three runs using 2 cm×2 cm substrates. The growth rate was perfectly uniform within measurement precision. The compositional uniformity of a typical $GaAs_{1-x}P_x$ film grown with this reactor vessel and method is given by electron probe microanalysis data in FIG. 5, which shows near perfect uniformity of each constituent of the film over the width of the substrate. The reactor design yields films of uniform thickness and composition to within ±2.5%.

The vortex flow pattern over the substrate surface explains one of the important reasons for the uniformity that is achieved. As a predetermined volume of gas is diverted at the separation point for flow over the substrate surface, the gas volume initially is in contact with a maximum area of substrate surface. Continued central vortex flow of this gas volume places the gas in contact with an increasingly smaller substrate surface area, while at the same time, the concentration of the reactive species in the gas is reduced because of prior interaction with the outer areas of the substrate surface. Compositional differences that usually arise because of differing cracking efficiencies between gas constituents apparently are minimized by the same inward vortex flow, as the species that are more stable to pyrolytic decomposition are swept over the smaller central areas of the substrate more rapidly than over the larger, outer areas.

The foregoing is considered as illustrative only of the principles of the invention. Further, since numerous modifications and changes will readily occur to those skilled in the art, it is not desired to limit the invention to the exact construction and operation shown and described, and accordingly, all suitable modifications and equivalents may be regarded as falling within the scope of the invention as defined by the claims that follow.

The embodiments of the invention in which an exclusive property or privilege is claimed are defined as follows:

1. A reactor vessel for chemical vapor deposition of a uniform semiconductor film on a substrate, comprising:
   a generally cylindrical reaction chamber for receiving a substrate and a flow of reaction gas capable of depositing a film on the substrate under the conditions of the chamber, said chamber having upper and lower portion and being oriented about a vertical axis;
   a supporting means having a substrate support surface generally perpendicular to said vertical axis for carrying the substrate within the lower portion of the reaction chamber in a predetermined relative position with respect to the upper portion of the reaction chamber, said upper portion including a cylindrically shaped confinement chamber, said confinement chamber having a smaller diameter than the lower portion of the reaction chamber and being positioned above said substrate support surface; and a means for introducing a reaction gas into said confinement chamber in a nonaxial direction so as to direct said reaction gas into said lower portion of said reaction chamber with a non-axial flow having a rotational component with respect to said vertical axis such that the reaction gas defines an inward vortex flow pattern with respect to the substrate surface.

2. The reactor vessel of claim 1, wherein said means for introducing a reaction gas comprises an injection conduit having an entrance port located within the confinement chamber above the plane of said substrate support surface, the conduit directing reaction gas through the entrance port along a path that is non-radial with respect to said vertical axis.

3. The reactor vessel of claim 1, wherein said substrate support surface is substantially circular, of approximately the same diameter as said confinement chamber and aligned coaxially therewith, and wherein said substrate support surface is spaced below the confinement chamber such that, in use, reaction gas from the confinement chamber laterally expands into the reaction chamber before contacting a substrate on the substrate support surface.

4. The reactor vessel of claim 3, further comprising a plurality of injection condutis communicating with the confinement chamber by a corresponding plurality of entrance ports arranged symetrically about the perimeter of the confinement chamber.

5. A reactor vessel for growing uniform epitaxial films on a substrate by chemical vapor deposition, wherein the vessel is of the type having a reaction chamber bounded by a vertical cylindrical side wall, a substrate supporting pedestal carried in the reaction chamber and disposed with a substantially horizontal substrate-supporting face defining between its edges and said side wall a gap for passage of reaction gas, a reaction gas injection conduit communicating with the reaction chamber above the substrate pedestal for introducing reaction gas under positive pressure, and a reaction gas exit port located below the substrate-supporting face for permitting downflow of gas through said gap, characterized in that:

said vertical cylindrical side wall includes an upper cylindrical confinement chamber of reduced diameter containing said injection conduit and a lower cylindrical portion of enlarged diameter containing said substrate-supporting face;

said injection conduit is positioned to introduce reaction gas into the confinement chamber with a non-axial flow component such that the flowing gas is directed by the cylindrical shape of the confinement chamber to follow a descending helical path prior to reaching said substrate-supporting face, and thereafter at least a portion of said gas is directed in an inward spiral pattern over the substrate-supporting face.

6. The reactor vessel of claim 5, wherein said injection conduit is positioned to direct reaction gas in a plane substantially horizontal to the axis of the reaction chamber and at a chord to said confinement chamber.

7. The reactor vessel of claim 6, wherein said injection conduit is positioned to direct reaction gas along a chord that is tangent to an inside surface of the confinement chamber.

8. The reactor vessel of claim 5 characterized in that said confinement chamber has an open bottom communicating with the lower side wall portion of the reaction chamber, said confinement chamber being connected to the reaction chamber by a horizontal, annular wall connecting a side wall of said confinement chamber to the lower cylindrical side wall portion of the reaction chamber.

9. The reactor vessel of claim 8, characterized in that said substrate-supporting face is spaced below said annular wall, such that, in use, the descending helical gas stream expands beyond the diameter of the confinement chamber before reaching the level of the substrate-supporting face.

* * * * *